United States Patent [19]

Ootsuka et al.

[11] Patent Number: 4,937,645

[45] Date of Patent: Jun. 26, 1990

[54] SEMICONDUCTOR DEVICE AND A METHOD OF MANUFACTURING THE SAME

[75] Inventors: Fumio Ootsuka; Osamu Tsuchiya, both of Ohme, Japan

[73] Assignee: Hitachi, Ltd., Tokyo, Japan

[21] Appl. No.: 169,219

[22] Filed: Mar. 16, 1988

[30] Foreign Application Priority Data

Mar. 16, 1987 [JP] Japan .................. 62-58818

[51] Int. Cl.[5] ........................................... H01L 27/02
[52] U.S. Cl. ....................................... 357/42; 357/23.6; 357/23.9; 357/23.3
[58] Field of Search .................. 357/42, 23.6, 23.9, 357/23.3, 51

[56] References Cited

U.S. PATENT DOCUMENTS

| 4,577,391 | 3/1986 | Hsia et al. | 29/571 |
| 4,616,401 | 10/1986 | Takeuchi | 357/23.9 |
| 4,742,018 | 5/1988 | Kimura et al. | 357/23.6 |
| 4,811,076 | 3/1989 | Tigelaar et al. | 357/51 |

FOREIGN PATENT DOCUMENTS 62-219659 9/1987 Japan .................. 357/23.6

OTHER PUBLICATIONS

IEDM Technical Digest, Dec. 1985, pp. 56-63.

Primary Examiner—Andrew J. James
Assistant Examiner—Mark Prenty
Attorney, Agent, or Firm—Antonelli, Terry, Stout & Kraus

[57] ABSTRACT

A semiconductor device comprising n-channel MIS-FETs and p-channel MISFETs each having a gate electrode having side walls selectively provided with side wall insulating films, and a method of manufacturing such a semiconductor device. The side wall insulating films covering the side walls of the gate electrodes of the MISFETs are formed by etching a single insulating film, formed simultaneously over all the MISFETs in a single processing step. The length of the side wall insulating films of the gate electrode of the n-channel MISFET, along the direction of channel length, is about 0.3 μm or above. The length of the side wall insulating films of the gate electrode of the p-channel MISFET, along the direction of channel length, is smaller than the length of the side wall insulating films of the n-channel MISFET.

16 Claims, 6 Drawing Sheets

SEMICONDUCTOR DEVICE AND A METHOD OF MANUFACTURING THE SAME

BACKGROUND OF THE INVENTION

The present invention relates to a technique effectively applicable particularly to a semiconductor integrated circuit having metal insulator semiconductor field effect transistors (hereinafter abbreviated to "MISFETs").

A semiconductor integrated circuit of a high degree of integration employs an n-channel MISFET of a lightly doped drain (hereinafter abbreviated to "LDD") structure. The MISFET of an LDD structure has a drain region of low impurity concentration formed between a drain region of high impurity concentration and a channel forming region (that is, between a drain region of high impurity concentration and the region beneath the gate electrode of the MISFET). The drain region of low impurity concentration is formed integrally with the drain region having a high impurity density. It is an ordinary practice to form a lightly doped region by introducing an n-type impurity into the region through an ion implanting process using a gate electrode as a mask. The drain region of high impurity concentration is formed by introducing an n-type impurity into the region through an ion implantation process using a side wall insulating film selectively formed over the side walls of a gate electrode as a mask. The side wall insulating film can selectively be formed by forming a silicon oxide film over the side walls of a gate electrode through a chemical vapor deposition (hereinafter abbreviated to "CVD") process, and etching the silicon oxide film through an anisotropic etching process such as a reactive ion etching (hereinafter abbreviated to "RIE") process.

In a MISFET of such an LDD structure, the electric field intensity near the drain region can be reduced by reducing the impurity concentration gradient at the pn junction between the drain region and the channel forming region. That is, an MISFET of an LDD structure is featured by a capability of suppressing the generation of hot carriers and preventing the time-dependent deterioration of the threshold electrode. Furthermore, since an MISFET of an LDD structure has a portion having a low impurity density in the drain region, the diffusion of the drain region into the channel forming region is suppressed, and thereby an effective channel length is secured. That is, the MISFET of an LDD construction is featured by the capability of reducing the channel length while preventing the short channel effect.

A semiconductor integrated circuit having a complementary MOSFET (CMOS) is optimal for increasing operating speed and for reducing power consumption. To reduce the manufacturing process steps, in the CMOS of an LDD structure a side wall insulating film is formed over the side walls of the respective ate electrodes of the n-channel MISFET and the p-channel MISFET. In one technique, the p-channel MISFET, similarly to the n-channel MISFET, is formed in an LDD structure by providing a lightly doped region. Alternatively, the p-channel MISFET, while using a side wall insulating film, is provided without providing any lightly doped region. A side wall insulating film is formed also over the side walls of the gate electrode of a p-channel MISFET not formed in an LDD structure.

The CMOS of an LDD construction is published, for example, in International Electron Devices Meeting, Technical Digest, pp. 59-62, 1985, and U.S. Pat. No. 4,577,391.

SUMMARY OF THE INVENTION

The inventors of the present invention found the following problems in the CMOS of an LDD structure.

In a CMOS manufactured through a so-called 1.3 μm process, in which the minimum processing size is 1.3 μm, the impurity concentration of the lightly doped region of the n-channel MISFET of an LDD structure is on the order to $1 \times 10^{18}$ atoms/cm$^3$. The impurity concentration of the lightly doped region is determined so that the drop of the threshold voltage due to the short channel effect, and the reduction of current driving force due to increase in resistance, are prevented. The length of the lightly doped region along the direction of the channel length must be about 0.3 μm or above to secure the pressure resistance between the source region having a high impurity concentration and the drain region under such conditions. That is, the length of the side wall insulating film formed over the side walls of the gate electrode of the n-channel MISFET along the direction of the channel length (hereinafter, length of the side wall insulating film) must be substantially about 0.3 μm or above. (By direction of the channel length is meant the direction of a line, parallel to the substrate surface, connecting the two sides of the gate electrode on which the side wall insulating films are formed. The length of the side wall insulating film along this direction is the distance, in this direction, that the side wall insulating film extends beyond the side wall of the gate electrode. As can be appreciated, such length is the thickness along a direction perpendicular to the side surface of the gate electrode.)

On the other hand, in the p-channel MISFET of either an LDD structure or not, the impurity concentration of the drain region on the side of the channel forming region is on the order of $1 \times 10^{18}$ atoms cm$^3$ to prevent a drop of the threshold voltage due to the short channel effect. Furthermore, since the p-channel MISFET is formed through the same manufacturing process as that for forming the n-channel MISFET, the side wall insulating films formed over the side walls of the gate channels of the p-channel MISFET and the n-channel MISFET are the same in size.

In the p-channel MISFET of the CMOS thus constructed, positive charge is liable to be trapped by the interface between the side wall insulating film and the semiconductor substrate and by the side wall insulating film. That is, since the semiconductor substrate is formed of silicon, and the side wall insulating film is formed of a substance comprising silicon, positive charge is liable to be trapped by the free bonding hands of silicon atoms. When positive charge is trapped, the carrier of the drain region having a low impurity concentration of the p-channel MISFET is depleted and the series resistance between the source region and the drain region increases, and thereby the current driving force of the p-channel MISFET is reduced.

The inventors of the present invention elucidated through experiments and examination of the experimental results that the current driving force of the p-channel MISFET is deteriorated remarkably when the side wall insulating film of the p-channel MISFET is formed on the basis of the size of the side wall insulating film of the n-channel MISFET, namely, when the size of the p-channel MISFET is about 0.3 μm or above.

Accordingly, it is a first object of the present invention to provide a technique capable of securing the pressure resistance of the n-channel MISFET of a semiconductor integrated circuit having a CMOS of an LDD structure, and capable of improving the current driving force of the p-channel MISFET of the same semiconductor integrated circuit, and the device formed by such technique.

It is a second object of the present invention to provide a technique capable of reducing manufacturing processing steps for achieving the first object of the invention.

It is a third object of the present invention to provide a technique capable of achieving the second object of the invention by reducing insulating film-forming processes for forming a side wall insulating film of an LDD construction.

It is a fourth object of the present invention to provide a technique capable of achieving the third object of the invention in a semiconductor integrated circuit having a CMOS of an LDD structure, and capable of a storage function.

It is a fifth object of the present invention to provide a technique capable of achieving the fourth object of the invention, providing a semiconductor integrated circuit with a storage function without damaging the CMOS forming region and manufacturing such a semiconductor integrated circuit through a reduced number of manufacturing processing steps.

The above and other objects, features and advantages of the present invention will become apparent from the following description taken in conjunction with the accompanying drawings.

Prior to the detailed description of the preferred embodiments of the present invention, representative inventions among those disclosed in this specification will be described briefly hereinafter.

In a semiconductor integrated circuit having a CMOS of an LDD structure, the side wall insulating film of the p-channel MISFET is formed to have a length, in the direction of the channel length, smaller than that of the side wall insulating film of the n-channel MISFET.

In the semiconductor integrated circuit, insulating films are formed through a CVD process so as to cover the gate electrodes of the n-channel and p-channel MISFETs, a side wall insulating film is formed by the insulating film of the n-channel (or p-channel) MISFET, and then a side wall insulating film is formed by the insulating film of the other of the p- or n-channel MISFETs.

In the semiconductor integrated circuit, insulating films are formed through a CVD process so as to cover the gate electrodes of regions for forming the n-channel and p-channel MISFETs, a side wall insulating film is formed by the insulating film in the n-channel (or p-channel) MISFET forming region by using a first mask, a source region and a drain region are formed by using the first mask, a side wall insulating film is formed by the insulating film in the p-channel (or n-channel) MISFET forming region by using a second mask, and then a source region and a drain region for the p-channel (or n-channel) are MISFET formed by using the second mask.

In a semiconductor circuit having a CMOS of an LDD structure and a memory cell in the form of a MISFET of an LDD structure, insulating films are formed through a CVD process so as to cover the gate electrodes of regions for forming the n-channel MISFET, the p-channel MISFET and the memory cell, a side wall insulating film is formed by the insulating film in the region for forming the n-channel (or p-channel) MISFET, a side wall insulating film is formed by the insulating film in the region for forming the other of the p-channel (or n-channel) MISFET, a side wall insulating film is formed by the insulating film in the region for forming the MISFET of the memory cell before or after forming the side wall insulating film of the n-channel MISFET or after forming the side wall insulating film of the p-channel MISFET.

In a semiconductor integrated circuit having a CMOS of an LDD structure and a memory cell comprising a series circuit of an MISFET of an LDD construction and a storage element (e.g., capacitor) formed of a conductive layer formed above the gate electrode of the MISFET, insulating films are formed through a CVD process so as to cover the gate electrodes of regions respectively for forming the n-channel MISFET, the p-channel MISFET and the MISFET for the memory cell, a side wall insulating film is formed by the insulating film in the region for forming the MISFET for the memory cell, the storage element is formed, a side wall insulating film is formed by the insulating film in the region for forming the n-channel (or p-channel) MISFET, and then a side wall insulating film is formed by the insulating film in the region for forming the other of the p-channel (or n-channel) MISFET.

Thus, according to the present invention, the respective side wall insulating films of the n-channel and p-channel MISFETs are formed through separate processing steps, respectively. Accordingly, the portion of the source region of high impurity concentration and the portion of the drain region of high impurity concentration can be sufficiently isolated from each other, in the n-channel MISFET, so that the pressure resistance between the source region and the drain region can be secured; and the series resistance of the source region and that of the drain region can be reduced by forming the lightly doped region of the p-channel MISFET in a small size (having a small length, in the direction of channel length; that is, a smaller length than the length of the lightly doped region of the n-channel MISFET), and thereby the current driving force is improved.

Furthermore, since the insulating films for forming the respective side wall insulating films of the n-channel MISFET and of the p-channel MISFET are formed through a single process, the number of manufacturing process steps are reduced.

Still further, since the first mask for forming the side wall insulating film of the n-channel MISFET is used also for forming the source region and the drain region of the n-channel MISFET, and the second mask for forming the side wall insulating film of the p-channel MISFET is used also for forming the source region and the drain region of the p-channel MISFET, the number of mask forming processes is reduced, and thereby the number of manufacturing processing steps is reduced.

Further, since the insulating films for forming the respective side wall insulating films of the n-channel MISFET, the p-channel MISFET and the MISFET of the memory cell are formed through a single processing step, the number of manufacturing processing steps is reduced.

Moreover, since the respective insulating films in the regions for forming the n-channel MISFET, the p-channel MISFET and the MISFET of the memory cell can serve as protective films in forming the storage element (capacitor), damage of the regions for forming the n-channel MISFET and the p-channel MISFET is prevented.

DESCRIPTION OF THE PREFERRED EMBODIMENTS

Figure 1:
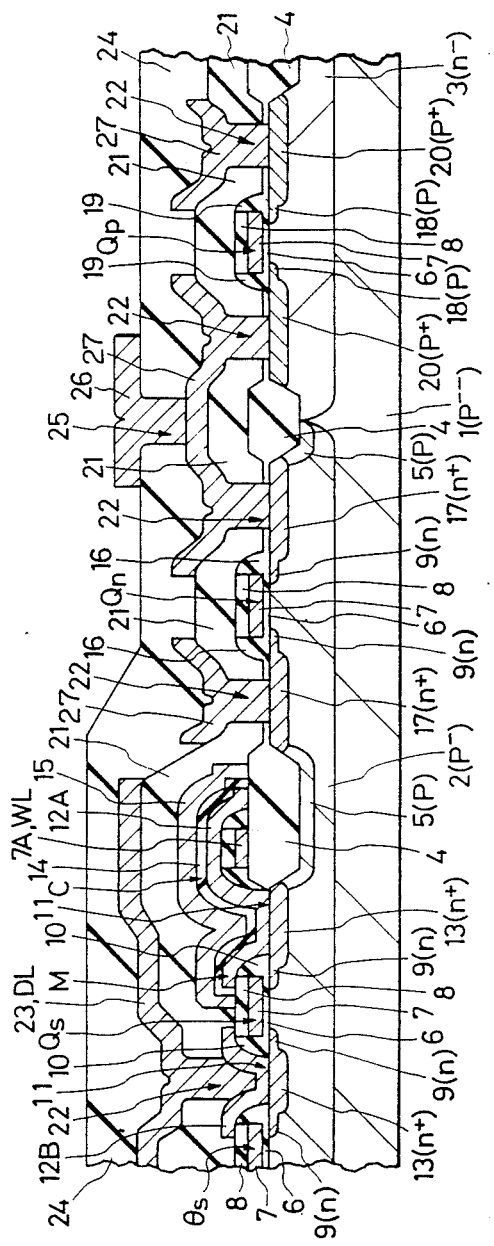
FIG. 1 is a fragmentary sectional view of an illustrative portion of a semiconductor integrated circuit having a CMOS (complementary metal oxide semiconductor), in a first embodiment, according to the present invention.

Referring to FIG. 1, shown in section in the left-hand side of FIG. 1 is the memory cell of a DRAM comprising a data-storing capacitor element of a stacked capacitor structure, and shown in the right-hand side of FIG. 1 is a CMOS forming the peripheral circuits of the DRAM.

Figure 2:
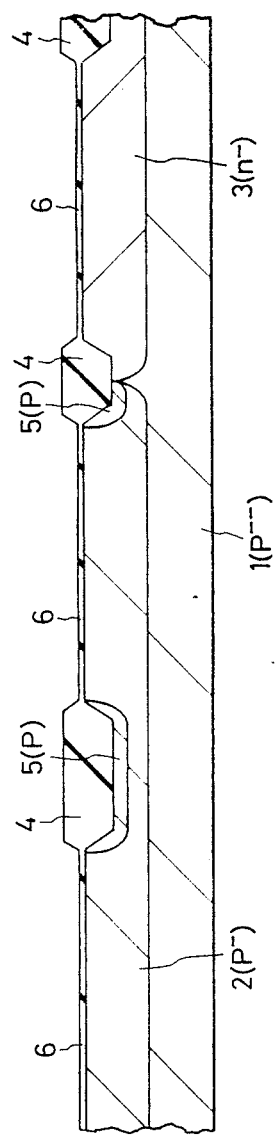
FIGS. 2-11 are sectional views for illustrating processing steps of manufacturing thee semiconductor integrated circuit of FIG. 1.

As shown in FIG. 1, a $p^-$-type well region 2 and an $n^-$-type well region 3 are formed extending from a major surface of a $p^-$-type semiconductor substrate 1. The semiconductor substrate 1 is a monocrystalline silicon substrate. The memory cell M of the DRAM, and the n-channel MISFET Qn of the CMOS are formed in the well region 2. The p-channel MISFET Qp of the CMOS is formed in the well region 3. In FIG. 2, the memory cell M and the MISFET Qn are formed in the same well region 2, however, it is desirable to form the memory cell M and the MISFET Qn in separate well regions, respectively.

In the respective major surfaces of the well regions 2 and 3 between semiconductor element forming regions, field insulating films (insulating films for insulating the elements from each other) 4 are formed. Formed under the field insulating films 4 (e.g., extending from the field insulating films 4), in the well region 2, are p-type channel stopper regions 5 having an impurity concentration higher than that of the well region 2. An n-type channel stopper region, not shown, may be formed below each field insulating film 4 (e.g., extending from the field insulating films 4) in the well region 3. The field insulating films 4 and the channel stopper regions 5 are formed so as to insulate the semiconductor elements electrically.

The memory cell M of the DRAM comprises a series circuit of a switching n-channel MISFET Qs and an information storage capacitor element C, formed in and above the major surface of the well region 2.

The MISFET Qs comprises the well region 2, gate insulating film 6, gate electrode 7, n-type semiconductor regions (lightly doped regions) 9 for forming drain regions (more specifically, a pair of regions for forming source and drain regions) and $n^+$-type semiconductor regions 13 for forming drain regions (more specifically, a pair of regions for forming source and drain regions).

The gate electrode 7 is formed of a conductive layer, for example, of a polycrystalline silicon film containing an impurity, such as P or As, for reducing the resistance. Alternatively, the gate electrode 7 may be formed of a single layer of a metallic film having a high melting point, e.g., a refractory metal, such as Mo, Ti, Ta or W, or a metal silicide having a high melting point, e.g., a refractory metal silicide, such as $MoSi_2$, $TiSi_2$, $TaSi_2$ or $WSi_2$. Further, the gate electrode 7 may be formed of a laminated film formed by coating a polycrystalline silicon film with a metallic film having a high melting point, or with a metal silicide having a high melting point. The gate electrode 7 extends in the direction of the gate width. The gate electrode 7 is formed integrally to form a word line (WL) 7A extending over the field insulating film 4. The gate electrode 7, namely, the conductive layer, is covered with insulating films 8 formed through a CVD process in the same shape as that of the gate electrode 7, respectively.

The n-type semiconductor region 9 having a low impurity concentration is formed integrally with an $n^+$-type semiconductor region 13 having a high impurity concentration and contiguously with a channel forming region. As is clear from FIG. 1, $n^+$-type semiconductor region 13 extends to a greater depth from the substrate surface than does n-type semiconductor region 9. The semiconductor region 9 is an integral part of the MISFET Qs of an LDD structure. The semiconductor region 9 is formed by doping the well region 2 with an n-type impurity, for example, P, by using the gate electrode 7 and the insulating film 8 covering the gate electrode 7 as a mask. That is, the semiconductor region 9 is formed by self-alignment with the gate electrode 7. The semiconductor region 9 is formed so as to prevent drop of threshold voltage due to the short channel effect, and to prevent reduction of current driving force due to an increase in resistance. When the 1.3 μm process is applied to forming the semiconductor region 9, the impurity concentration of the semiconductor region 9 is on the order to $1 \times 10^{18}$ atoms/cm$^3$.

Each semiconductor region 13 having a high impurity concentration is formed by doping the well region 2 with an n-type impurity, for example, P or As, by using side wall insulating films 10 formed selectively on the side wall of the gate electrode 7, together with the gate electrode 7 and insulating film 8 over the gate electrode, as a mask. The semiconductor regions 13 are formed by diffusing the impurity through connecting holes 11 from the electrode 12A of an information storage capacitor element C and from an intermediate conductive layer 12B, respectively. That is, the semiconductor regions 13 are formed by self-alignment with the side wall insulating films 10. The impurity concentration of the semiconductor regions 13 is on the order to $1 \times 10^{20}$ atoms/cm$^3$.

The length of the semiconductor regions 9 having a low impurity concentration along the direction of the channel length is about 0.3 μm or above to prevent punch-through and to secure the pressure resistance between the semiconductor regions 13 having a high impurity concentration. The length of the semiconductor regions 9 is dependent substantially on the length (the thickness along a direction perpendicular to the side surface of the gate electrode) of the side wall insulating films 10, and is about 0.3 μm or above.

The information storage capacity element C is formed in a stacked capacitor construction (STC construction) by sequentially forming the lower electrode 12A, a dielectric film 14 and an upper electrode 15.

The electrode 12A is connected through the connecting hole 11 to one of the semiconductor regions 13 of the MISFET Qs. Each memory cell M is provided with the electrode 12A. The electrode 12A is formed so as to overlap the gate electrode 7 and the word line 7A to secure the stored charge, namely, the information, of the information storage capacitor element C. The electrode 12A is insulated electrically from the electrode 7 and the word line 7A by the insulating films 8 respectively formed over the gate electrode 7 and the word line 7A. The electrode 12A is formed, for example, of polycrystalline silicon film doped with an n-type impurity for reducing resistance, such as P or As.

The dielectric film 14 is a single silicon oxide film, a single silicon nitride film or a composite film of a silicon oxide film and a silicon nitride film.

The electrode 15 is formed over the dielectric film 14 covering the electrode 12A. The electrodes 15 of the memory cells M of a memory array are formed integrally. The electrodes 15, similarly to the electrode 12A, is formed, for example, of a polycrystalline silicon film doped with, e.g., an n-type impurity to reduce resistance.

The other semiconductor region 13 of the MISFET Qs is connected through the intermediate conductive layer 12B to a data line DL 23.

The intermediate conductive layer 12B and the electrode 12A are formed through the same manufacturing processing steps (are formed simultaneously). The intermediate conductive layer 12B is connected through the connecting hole 11 defined by the side wall insulating film 10 to the semiconductor layer 13, and overlaps the gate electrodes 7. Since the intermediate conductive layer 12B is connected to the semiconductor region 13 so as to be in self-alignment with the gate electrodes 7, the data line DL 23 and the semiconductor region 13 can be interconnected substantially in a self-aligning fashion.

The data line DL 23 is connected through a connecting hole 2 formed in a layer insulating film 21 to the intermediate conductive layer 12B. The data line 23 is formed of a low resistance wiring material for the first layer, for example, aluminum or aluminum containing additives such as Si and Cu.

The CMOS forming the peripheral circuits of the DRAM comprises the n-channel MISFET Qn formed in and above the major surface of the well region 2, and the p-channel MISFET Qp formed in and above the major surface of the well region 3.

The n-channel MISFET Qn comprises the well region 2, a gate insulating film 6, a gate electrode 7, a pair of n-type semiconductor regions 9, namely, for the source and drain regions, respectively, a pair of $n^+$-type semiconductor regions 17 for the source and drain regions, respectively.

The n-type semiconductor regions 9 having a low impurity concentration, similarly to those of the MISFET Qs of the memory cell, form an MISFET Qn of an LDD structure. The semiconductor regions 9 of the MISFET Qn and those of the memory cell M are formed through the same manufacturing processing steps (are simultaneously formed), and hence the impurity concentration of the semiconductor regions 9 of the MISFET Qn is on the order of $1 \times 10^{18}$ atoms/cm$^3$. The length of the semiconductor regions 9 along the direction of the channel is dependent on the length of a side wall insulating film 16 formed selectively over the side wall of the gate electrode 7. The length of the side wall insulating film 16 along the direction of the channel is about 0.3 μm or above, which is substantially the same, for example, as that of the MISFET Qs of the memory cell M.

The p-channel MISFET Qp comprises the well region 3, a gate insulating film 6, a gate electrode 7, a pair of p-type semiconductor regions 18, namely, for the source and drain regions, respectively, and a pair of $p^+$-type semiconductor regions 20 for the source and drain regions, respectively.

The p-type semiconductor regions 18 having a low impurity concentration, as in the MISFET Qn, form the MISFET Qp of an LDD structure. The impurity concentration of the semiconductor regions 18 is, for example, on the order of $1 \times 10^{18}$ atoms/cm$^3$, i.e., B-concentration, to prevent drop of the threshold voltage due to the short channel effect. The length of the semiconductor regions 18 along the direction of channel length is smaller than those of the semiconductor regions 9 of the MISFETs Qn and Qs. That is, the length of side wall insulating films 19 along the direction of channel length is smaller than those of the side wall insulating films 10 of the MISFET Qs and the side wall insulating films 16 of the MISFET Qn. When the side wall insulating films 19 are formed through the 1.3 μm process, the length of the side wall insulating films 19 is 0.3 μm or below.

In the CMOS of an LDD structure thus constructed, the length of the semiconductor regions 18 (lightly doped regions) of the MISFET Qp is reduced to reduce the series resistance of a portion 20 of the semiconductor regions (a portion of the source region and of the drain region), by forming the side wall insulating films 19 of the p-channel MISFET Qp in a length shorter than the side wall insulating films 16 of the n-channel MISFET Qn. Thereby, with the resulting structure the current driving force is increased, and, at the same time, since the length of the semiconductor regions 9 (lightly doped regions) of the MISFET Qn is enlarged to space the semiconductor regions 17 (the source region and the drain region) from each other, the pressure resistance between the semiconductor regions 17 can be secured.

When the p-channel MISFET Qp is not of an LDD structure, and when the source region or the drain region is formed only of the semiconductor region 20, the impurity density of at least the drain region near the channel forming region is $1 \times 10^{19}$ atoms cm$^3$. Since the effective channel length of the p-channel MISFET Qp is dependent on the side wall insulating film 19, the present invention is applicable to a CMOS employing a p-channel MISFET Qp of a structure other than an LDD structure.

The semiconductor regions 17 of the MISFET Qn, and the semiconductor regions 20 of the MISFET Qp, are connected through connecting holes 22 to wiring lines 27, respectively. A predetermined wiring line 27 is connected to a wiring line 26. The material forming the wiring line 26 is the same as that forming the resistance wiring in the second layer, for example, the material forming the wiring lines 27. The wiring line 26 is connected through a connecting hole 25 formed through an insulating film 24 to the wiring line 27.

A method of manufacturing the semiconductor integrated circuit described hereinbefore will be described briefly hereinafter with reference to FIGS. 2 through 11 showing the different manufacturing processes.

First, the $p^-$-type semiconductor substrate 1 is prepared.

Then, the $p^-$-type well region 2 is formed in a major surface of the semiconductor substrate 1 selectively in regions for forming the memory array of the DRAM and the n-channel MISFET of the peripheral circuits. The $n^-$-type well region 3 is formed in the major surface of the semiconductor substrate 1 selectively in a region for forming the p-channel MISFET of the peripheral circuits.

Then, the field insulating films 4 are formed between semiconductor element forming regions over the respective major surfaces of the well regions 2 and 3. In the process for forming the field insulating films 4, p-type channel stopper regions 5 are formed under the field insulating films 4 between the semiconductor element forming regions on the major surface of the well region 2.

Then, the semiconductor element forming regions in the well regions 2 and 3 are doped (e.g., by ion implantation) with an impurity, for example, a p-type impurity such as boron, for adjusting the threshold voltage. To dope the well region 2 and the well region 3 in different impurity concentrations, respectively, masks, for example, silicon oxide films or photoresist films, differing from each other in thickness are used for doping.

As shown in FIG. 2, gate insulating films 6 are formed over the respective major surfaces of the well regions 2 and 3 in the semiconductor element forming regions. The gate insulating films 6 can be formed by thermal oxidation of the major surface of the well region 2 or 3. To provide the gate insulating films 6 with a predetermined permittivity, each gate insulating film 6 may be a composite film of a silicon oxide film and a silicon nitride film, formed by subjecting the major surfaces of the well regions 2 and 3 to a heat treatment using a nitrogen-containing compound, such as ammonia (thermal nitriding), during or after the thermal oxidation process.

Figure 3:
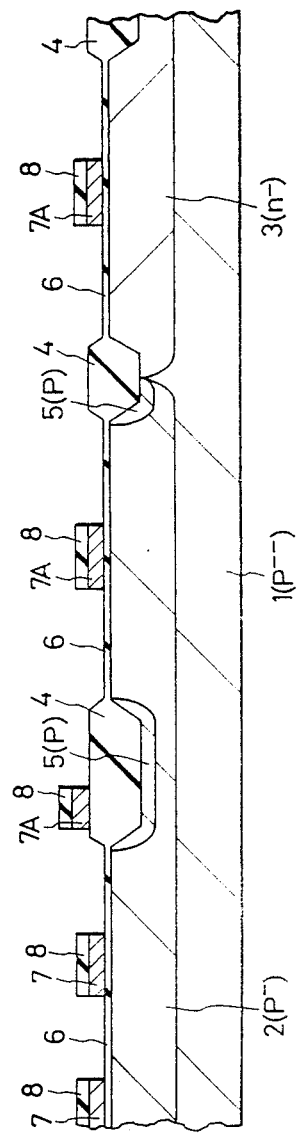

Then, as shown in FIG. 3, the gate electrodes 7 and the insulating films 8 respectively for covering the gate electrodes 7 are formed on the gate insulating film 6 in the MISFET forming region. The gate electrodes 7 are formed through a sputtering process or through a sputtering process and a CVD process, and the insulating films 8 are formed through a CVD process, each known in the art. The gate electrodes 7 and the insulating films are finished through an etching process. Simultaneously with forming the gate electrodes 7 and the insulating films 8, the word lines (WL) 7A and the insulating films 8 covering the word lines 7A are formed on the field insulating film 4 at predetermined positions. The same mask is used for etching the gate electrodes 7, the insulating films 8 covering the gate electrodes 7, the word line 7A and the insulating films 8 covering the word lines 7A. An anisotropic etching method capable of etching the side surfaces of the gate electrodes 7 perpendicularly to the surface of the semiconductor substrate 1, such as RIE, is applied to the etching process to enable the accurate adjustment of the thickness of the side wall insulating films, which are formed through the following process.

Then, at least the major surfaces of the well regions 2 and 3 are thermally oxidized to form thin silicon oxide films (a buffer layer) for protecting the major surfaces of the well regions 2 and 3 from damage due to doping.

Figure 4:
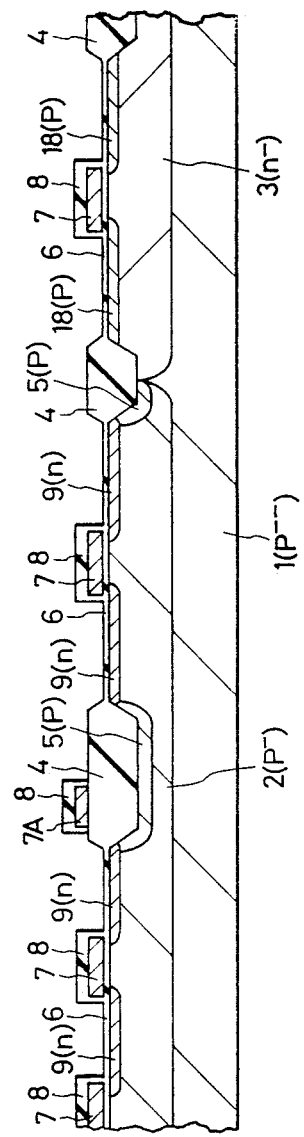

Then, as shown in FIG. 4, n-type semiconductor regions 9 of a low impurity density are formed in the major surface of the well region 2 selectively in a region for forming the MISFET Qs of the memory cell M and a region for forming the MISFET Qn of the CMOS. The semiconductor regions 9 are formed by doping the well region 2 with an n-type impurity, through an ion implanting process (known in the art) by using, mainly, the gate electrodes 7, the insulating films 8 and the field insulating films 4 as masks. During the process for forming the semiconductor regions 9, a region for forming the MISFET Qp is masked, for example, with a photoresist mask.

Then, as shown in FIG. 4, the p-type semiconductor regions 18 having a low impurity concentration are formed in the major surface of the well region 3 selectively in regions for forming the MISFET Qp of the CMOS. The semiconductor regions 18, similarly to the semiconductor regions 9, can be formed by doping the corresponding regions with a p-type impurity through an ion implanting process by using, mainly, the gate electrode 7, the insulating film 8 and the field insulating film 4 as masks. During the process for forming the semiconductor regions 18, the region for forming the MISFET Qn is masked with a mask, for example, a photoresist mask.

Figure 5:
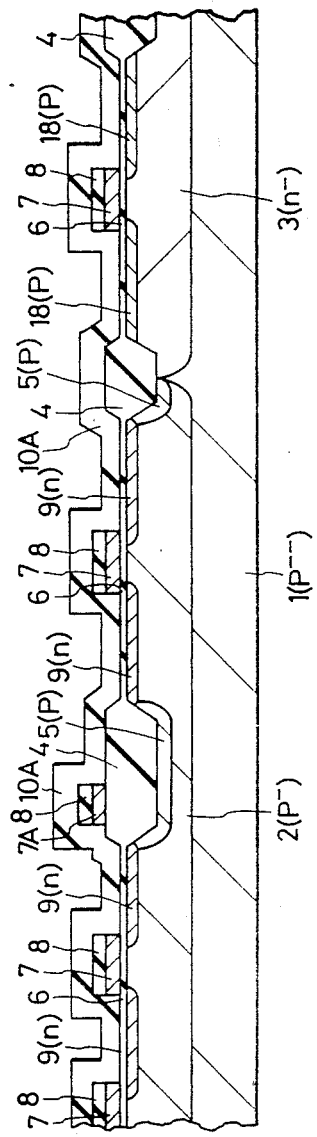

Then, as shown in FIG. 5, an insulating film 10A mainly for forming the side wall insulating films is formed over the entire area of the semiconductor substrate 1 so as to cover the gate electrode 7 through the insulating films 8. The insulating film 10A is, for example, a silicon dioxide film formed in substantially the same thickness as that of the gate electrodes 7, for example, a thickness on the order of 4000 Angstrom, through a CVD process. The insulating film 10A may be a silicon oxide film or a silicon nitride film, for example, formed through a CVD or a sputtering technique, each technique being known in the art.

Figure 6:
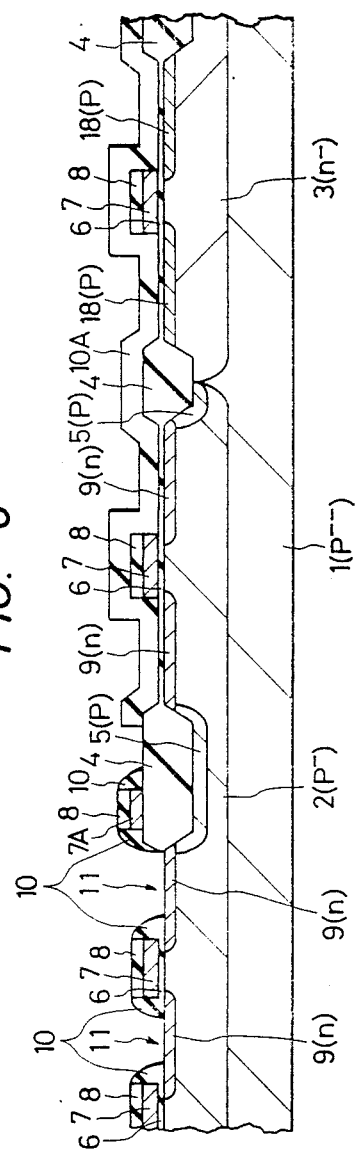

Then, as shown in FIG. 6, the side wall insulating films 10 are formed on the side walls of the gate electrodes 7 of the MISFET Qs in the region for forming the memory cell M. The side wall insulating films 10 can be formed by etching a portion of the insulating film 10A in the region for forming the memory cell M through an anisotropic etching process, such as RIE, by masking the insulating film 10A of the CMOS forming region with a photoresist mask (not shown). The side wall insulating films 10 are formed, as mentioned above, in a length of about 0.3 μm or above along the channel direction. A portion of the insulating film 10A extending in the CMOS forming region is not etched.

In forming the side wall insulating films 10, the connecting holes 11 defined by the side wall insulating films 10 are formed so as to expose the semiconductor region 9 (a region for forming the source region and the drain region), as shown in FIG. 6. Since the connecting holes 11 are defined by the side wall insulating films 10 which are matched to the gate electrodes 7, the connecting holes 11 are self-matched to the gate electrodes 7.

Figure 7:
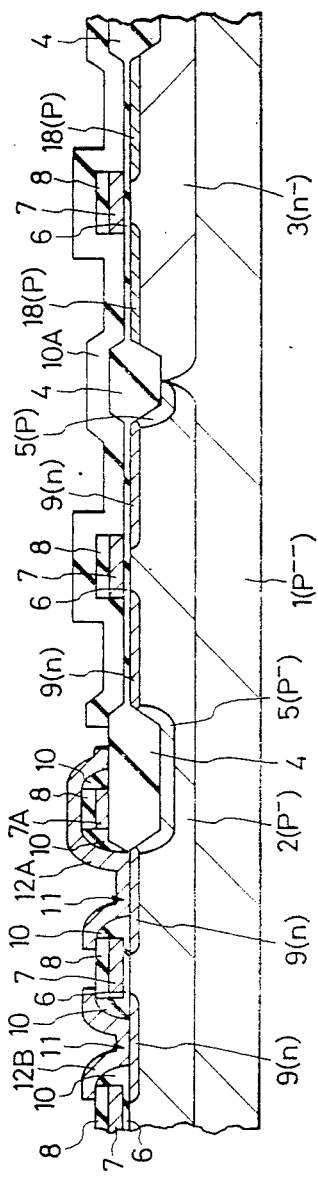

Then, as shown in FIG. 7, the electrodes 12A, namely, one of the electrodes of the information storage capacitor element C, and the intermediate conductive layer 12B are formed selectively in the region for forming the memory cell M. The electrode 12A and the intermediate conductive layer 12B as shown in FIG. 7 are formed through a step of forming a polycrystalline silicon film over the entire surface of the semiconductor substrate through a CVD process, a step of thermally oxidizing the surface of the polycrystalline silicon film, a step of doping the oxidized surface of the polycrystalline silicon film with an n-type impurity, for example, P, and a step of etching the polycrystalline silicon film in a predetermined shape through an anisotropic etching process, such as RIE, by using a mask, for example, a photoresist mask (as is known in the art).

The electrode 12A and the intermediate conductive layer 12B are respectively connected through the connecting holes 11 defined by the side wall insulating films 10 to the semiconductor region 9 forming part of the source region or the drain region of the MISFET Qs. The n-type impurity introduced into the electrode 12A and the intermediate conductive layer 12B diffuses into the semiconductor region 9 through the connecting holes 11.

In the CMOS forming region, the polycrystalline silicon film forming the electrode 12A and the intermediate conductive layer 12B is formed also over the insulating film 10A. However, the polycrystalline silicon film formed over the insulating film 10A is removed in processing steps respectively for patterning the electrode 12A and the intermediate conductive layer 12B.

Thus, the insulating films 10A are formed in the regions for forming the MISFETs Qn, Qp and Qs over the gate electrodes 7 and the insulating films 8 through the CVD process, the side wall insulating films 10 are formed by the insulating films 10A in the region for forming the MISFET Qs of the memory cell M, and the electrode 12A and intermediate conductive layer 12B of the information storage capacitor element C are formed without removing the insulating film 10A, and hence the insulating film 10A formed in the CMOS forming region functions as an etching mask in forming the electrode 12A and the intermediate conductive layer 12B. Accordingly, the surfaces of the regions for forming the MISFETs Qn and Qp in the well regions 2 and 3 are protected from damage (etching damages).

Furthermore, as will be described afterward, the insulating film 10A remaining in the CMOS forming region is mainly for forming the side wall insulating films 16 and 19 for the MISFETs Qn and Qs, and the insulating film 10A functions as both a film for forming the side wall insulating films and a protective film. Accordingly, the process for forming the insulating film for a protective film can substantially be omitted to reduce the manufacturing processing steps.

Then, the dielectric films 14 are formed selectively over the surface of the electrode 12A in the region for forming the data-storing capacitor element C. The film of a thermal oxide, on the electrode 12A, is removed, and then a silicon oxide film is formed through another thermal oxidation process, or a thin silicon nitride film is formed directly through a CVD process, and then the surface of the silicon nitride film is subjected to thermal oxidation.

Figure 8:
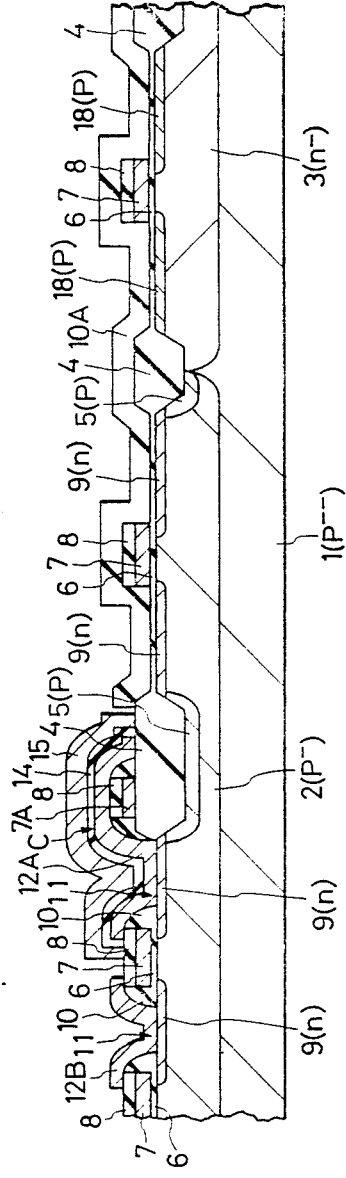

Then, as shown in FIG. 8, the other electrode 15 of the data-storing capacitor element C is formed in a region for forming the memory cell array in a portion over the dielectric film 14, and not over the connecting hole 11 and intermediate conductive layer 12B which provides electrical connection of one of the semiconductor regions 9 of the MISFET Qs and the data line. The electrode 15, substantially similarly to the electrode 12A, can be formed by forming a polycrystalline silicon film over the entire surface of the semiconductor substrate 1 through a CVD process and selectively etching the polycrystalline silicon film through an anisotropic etching process. Thus, the information storage capacity element C of the memory cell M is completed.

Since the insulating film 10A remaining in the CMOS forming region serves as a protective film in the process for forming the electrode 15 of the data-storing capacitor element C similarly to the insulating film 10A in the process for forming the electrode 12A, the surfaces of the regions for forming the MISFETs Qn and Qp in the well regions 2 and 3 can be prevented from damage without forming protective films thereon through additional processing steps.

Then, the side wall insulating films 16 are formed selectively on the gate electrode 7 in the region for forming the n-channel MISFET Qn of the CMOS. Then, as shown in FIG. 9, n+-type semiconductor regions 17 having a high impurity concentration are formed.

Figure 9:
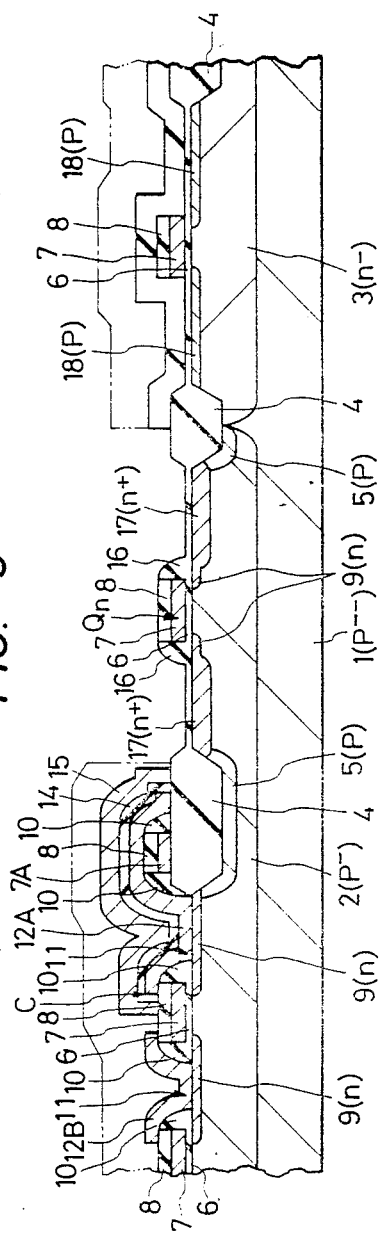

The side wall insulating films 16 can be formed by etching the insulating film 10A through an anisotropic etching process such as RIE by using a mask, for example, a photoresist mask, having an opening corresponding to the region for forming the MISFET Qn as indicated by alternate long and two-dash lines in FIG. 9. The length along the channel direction of the side wall insulating films 16 is, as mentioned above, 0.3 μm or above.

The n+-type semiconductor regions 17 can be formed by doping the well region 2 with an n-type impurity, for example, As, through an ion implanting process (known in the art) by using the same mask used for forming the side wall insulating films 16. The impurity introduced into the channel forming region of the semiconductor regions 17 is checked by the side wall insulating films 16. When a silicon oxide film is formed as a buffer layer in implanting the n-type impurity to control damages in the surface of the well region 2, it is preferable to use a heat-resistant mask for the mask shown in FIG. 9. The mask is removed after the semiconductor regions 17 have been formed.

Figure 10:
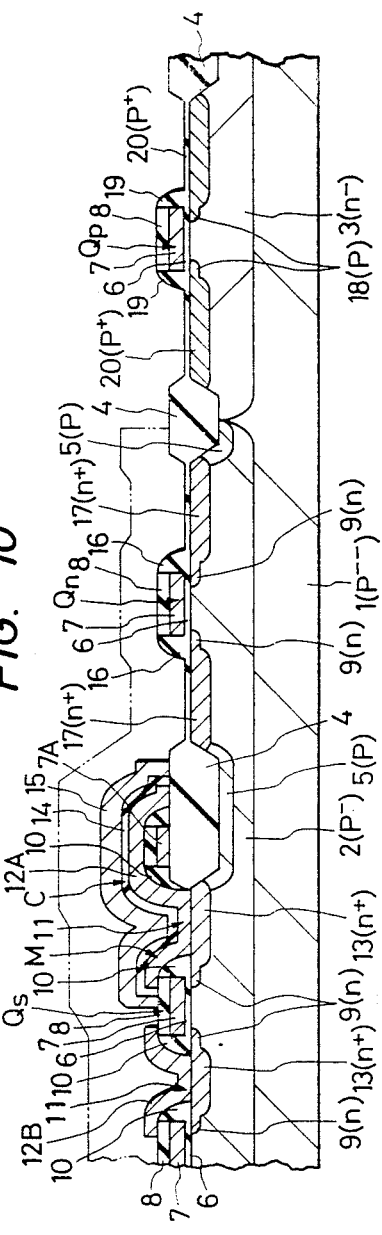
Figure 11:
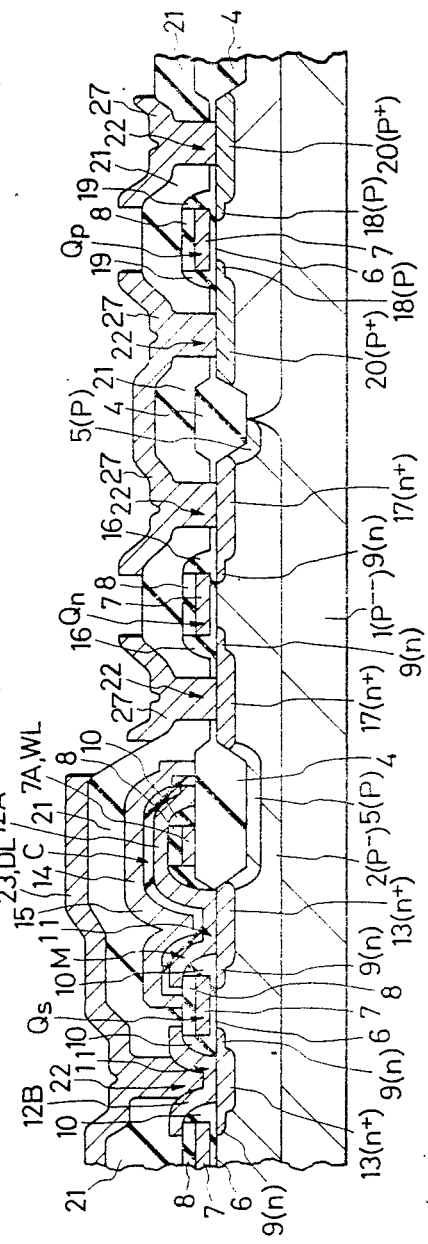

Then, the side wall insulating films 19 are formed selectively on the side walls of the gate electrode 7 and the insulating film 8 in the region for forming the p-channel MISFET Qp of the CMOS, and then, as shown in FIG. 10, the p+-type semiconductor regions 20 having a high impurity concentration are formed. As is clear from, e.g., FIG. 10, the p+-type semiconductor regions 20 extend to a greater depth from the substrate surface than does the p-type regions 18.

The side wall insulating films 19 can be formed by etching the insulating film 10A through an anisotropic etching process, such as RIE, by using a mask, for example, a photoresist mask, having an opening as indicated by alternate long and two short dashes lines in FIG. 10 corresponding to the region for forming the MISFET Qp. As mentioned above, the length of the side wall insulating films 19 along the direction of channel length is smaller than 0.3 μm (e.g., 0.1 μm to 0.25 μm). The side wall insulating films of the p-channel MISFET can be formed to have a smaller length in the direction of channel length than the length of the n-channel MISFET by modifying the etching conditions (for example, a combination of anisotropically reactive ion etching and isotropic etching can be used for forming side wall insulating films of the p-channel MISFETs, while using RIE to form side wall insulating films of the n-channel MISFETs).

The p+-type semiconductor regions 20 can be formed by doping the well region 3 with a p-type impurity through an ion implanting process by using the same mask as that used for forming the side wall insulating films 19. The introduction of the impurity into the semiconductor regions 2 on the side of the channel forming regions is controlled by the side wall insulating films 19. When a silicon oxide film is formed as a buffer layer for reducing damages in the surface of the well region 3 in doping the well region 3 with the p-type impurity, it is preferable to use a heat-resistant mask as the mask shown in FIG. 10. The mask is removed after the semiconductor regions 20 have been formed.

Then, as shown in FIG. 10, the semiconductor substrate 1 thus processed is subjected to an annealing process in a nitrogen gas atmosphere to stretch and diffuse the semiconductor regions 13 of the MISFET Qs, the semiconductor regions 17 of the MISFET Qn, and the semiconductor regions 20 of the MISFET Qp. Subsequently, the MISFET Qs is completed to complete the memory cell M, and the MISFETs Qn and Qp are completed to complete the CMOS.

Thus, the insulating films 10A are formed so as to cover the gate electrodes 7 and insulating films 8 of the MISFETs Qn and Qp in the region for forming the CMOS, the insulating film 10A in the region for forming the MISFET Qn is etched to form the side wall insulating films 16, and then the insulating film 10A in the region for forming the MISFET Qp is etched to form the side wall insulating films 19, so that the side wall insulating films 16 of the MISFET Qn, and the side wall insulating films 19 of the MISFET Qp, are formed by using the insulating films 10A formed through the same process. Accordingly, the processes for separately forming the insulating films for forming the side wall insulating films are curtailed, and thereby the overall manufacturing process can be curtailed. That is, the side wall insulating films 16 and 19 can be formed through a single process for forming the insulating films 10A and two etching processes. The side wall insulating films 16 of the MISFET Qn may be formed after forming the side wall insulating films 19 of the MISFET Qp.

Furthermore, since the insulating films 10A are formed over the ate electrodes and insulating films 8 in the regions respectively for forming the MISFETs Qn and Qp in the region for forming the CMOS, the side wall insulating films, and source and drain regions, for the MISFETs Qn and Qp can be formed with a reduced number of manufacturing steps. Thus, the insulating film 10A in the region for forming the MISFET Qn is etched to form the side wall insulating films 16 by using the first mask indicated by alternate long and two short dashes lines in FIG. 9, and the semiconductor regions 17 (a source region and a drain region) are formed by using the first mask. Moreover, then the insulating film 10A in the region for forming the MISFET Qp is etched to form the side wall insulating films 19 by using the second mask indicated by alternate long and two short dashes lines in FIG. 10, and then the semiconductor regions 20 (a source region and a drain region) are formed by using the second mask. The first mask for forming the side wall insulating films 16 of the MISFET Qn is used also for forming the semiconductor regions 17, and the second mask for forming the side wall insulating films 19 is used also for forming the semiconductor regions 20, so that mask forming processes for forming the semiconductor regions 17 and 20 can be omitted, and thereby the overall number of manufacturing processing steps can be curtailed. In the present invention, the side wall insulating films 16 and semiconductor regions 17 of the MISFET Qn may be formed after forming the side wall insulating films 19 and semiconductor regions 20 of the MISFET Qp.

Since the insulating films 10A are formed over the gate electrodes 7 and the insulating films 8 in the regions respectively for forming the MISFETs Qn, Qp and Qs in the regions for forming the memory cell and the CMOS, the number of processing steps for forming the side wall insulating films for the MISFETs Qn, Qp and Qs can be reduced. Specifically, the insulating film 10A in the region for forming the MISFET Qs of the memory cell M is etched to form the side wall insulating films 10, the insulating film 10A in the region for forming the MISFET Qn of the CMOS is etched to form the side wall insulating films 16, and then the insulating film 10A in the region for forming the MISFET Qp is etched to form the side wall insulating films 19. Thus, the respective side wall insulating films 16, 19 and 10 of the MISFETs Qn, Qp and Qs are formed by etching the insulating films 10A, which insulating films 10A are formed through the same processing step (formed simultaneously), so that the insulating films 10A need not be formed through individual processes respectively for forming the side wall insulating films 16, 19 and 10. In the present invention, the side wall insulating films 10 of the MISFET Qs of the memory cell M may be formed after forming the side wall insulating films 16 of the MISFET Qn or after forming the side wall insulating films 19 of the MISFET Qp.

Furthermore, since the insulating films 10A are formed over the gate electrodes 7 and the insulating films 8 in the regions for forming the MISFETs Qn, Qp and Qs, in the regions for forming the memory cell M and the CMOS, the insulating films 10A can be used as protective films during manufacture of the device. Specifically, the insulating film 10A in the region for forming the MISFET Qs is etched to form the side wall insulating films 10, then the electrode 12A or electrode 15 of the information storage capacitor element C of the memory cell M is formed, then the insulating film 10A in the region for forming the MISFET Qn is etched to form the side wall insulating films 16, and then the insulating film 10A in the region for forming the MISFET Qp is etched to form the side wall insulating films 19; the insulating films 10A in the regions respectively for forming the MISFETs Qn and Qp serve as protective films in forming the electrode 12A or electrode 15 of the information storage capacitor element C, so that the surface of the well region 2 in the region for forming the MISFET Qn, and the surface of the well region 3 in the region for forming the MISFET Qp, are protected from damage. Moreover, since the insulating films 10A (used for forming the side wall insulating films 16 and 19) serve as a protective film for the region for forming the CMOS when the capacitor element C of the memory cell is formed, as mentioned above, any additional processing steps is not necessary for forming the protective film.

Then, a layer insulating film 21, such as a phosphosilicate glass (PSG) film, is formed over the entire surface of the semiconductor substrate 1 through a CVD process, then connecting holes 22 are formed in the layer insulating film 21, and then the aluminum wiring lines 23 and 27 are formed through a sputtering process.

Then, a layer insulating film 24, such as PSG film, is formed over the entire surface of the semiconductor substrate 1 through a CVD process, and then a connecting hole 25 is formed through the layer insulating film 24. Then, as shown in FIG. 1, an aluminum wiring line 26 is formed through a sputtering process. Thus, the semiconductor integrated circuit having the CMOS and the DRAM, in a preferred embodiment according to the present invention, is manufactured through the series of manufacturing processes.

The principal effects of the present invention will be described hereinafter.

In a semiconductor integrated circuit having a CMOS of an LDD construction, the pressure resistance of the n-channel MISFET is secured and the current driving force of the p-channel MISFET can be enhanced.

Radiation damages resulting from trapping positive charge generated by radioactive rays penetrating the oxide films are prevented, to improve the reliability of the p-channel MISFET device.

Processing steps for forming an insulating film for forming the side wall insulating films can be curtailed.

Processing steps for forming etching masks for forming the side wall insulating films of an LDD construction can be curtailed.

In manufacturing a semiconductor integrated circuit having a CMOS of an LDD construction and capable of storage function, processing steps for forming the side wall insulating films of an LDD construction can be curtailed.

In forming the storage means, damage in the region for forming a CMOS are prevented and processing steps for forming the storage means can be curtailed.

Although the invention has been described with a certain degree of particularity with reference to a preferred embodiment thereof, many changes and variations are possible therein. It is therefore to be understood that the invention may be practiced otherwise than specifically described herein without departing from the scope and spirit thereof.

For example, the present invention is applicable to a semiconductor integrated circuit having a CMOS including an n-channel MISFET Qn having a p+-type semiconductor region having a high impurity concentration under the semiconductor region 9 (lightly doped region) having a low impurity concentration, namely, a so-called n-channel MISFET of a p-pocket construction.

The present invention is applicable to a semiconductor integrated circuit incorporating a DRAM having a memory cell comprising an information storage capacitor element using fine holes or a widely used information storage capacitor element of an MOS construction, in addition to a semiconductor integrated circuit including a DRAM having a memory cell comprising an information storage capacitor element of a stacked capacitor construction.

Furthermore, the present invention is applicable to a semiconductor integrated circuit having a mask ROM having a memory cell formed of MISFETs, an EROM or an EEPROM, and a CMOS.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

What is claimed is:

1. A semiconductor device comprising:
   (a) a semiconductor substrate having a first portion of a first conductivity type and a second portion of a second conductivity type, opposite the first conductivity type, each of the first and second portions extending to a surface of the semiconductor substrate; and
   (b) MISFETs formed in the semiconductor substrate, each MISFET having a gate electrode, the gate electrode having opposed side walls, with a channel region formed beneath the gate electrode, side wall insulating films formed over the opposed side walls of the gate electrode, and semiconductor regions serving as source and drain regions of the MISFETs formed in the semiconductor substrate, the MISFETs including a first group and a second group of MISFETs, the first group of MISFETs being formed in said first portion and the second group of MISFETs being formed in the second portion;
   wherein one of the first and second groups comprises a p-channel MISFET, and the other of the first and second groups comprises a n-channel MISFET, the semiconductor regions serving as source and drain regions of the p-channel MISFET each being of a p-type comprising a first region spaced apart from the channel region of the p-channel MISFET and a second region formed between the channel region of the p-channel MISFET and the first region, the semiconductor regions serving as source and drain regions of the n-channel MISFET each being of an n-type comprising a third region spaced apart from the channel region of the n-channel MISFET and a fourth region formed between the channel region of the n-channel MISFET and the third region, the second and fourth regions respectively having lower impurity concentrations than said first and third regions, wherein the length of the side wall insulating films of the p-channel MISFET along the direction of channel length is smaller than the length of the side wall insulating films of the n-channel MISFET along the direction of channel length, and wherein the second region is smaller in the direction of channel length than the fourth region, so that the series resistance of the source and drain regions of the p-channel MISFET is reduced while maintaining pressure resistance between source and drain regions of the n-channel MISFET.

2. A semiconductor device according to claim 1, wherein the side wall insulating films of each of the n-channel MISFET and the p-channel MISFET are formed of a same insulating material layer.

3. A semiconductor device according to claim 1, wherein the device further includes a memory cell comprising a MISFET, the MISFET of the memory cell having a gate electrode, the gate electrode having opposed side walls, with a channel region formed under the gate electrode, side wall insulating films formed over the opposed side walls of the gate electrode, and a semiconductor region serving as a source or drain region formed in the semiconductor substrate.

4. A semiconductor device according to claim 3, wherein the semiconductor region of the MISFET of the memory cell comprises a fifth region spaced apart from the channel region of the MISFET of the memory cell, and a sixth region formed between the channel region of the MISFET of the memory cell and the fifth region.

5. A semiconductor device according to claim 3, wherein said memory cell comprises a series circuit of said MISFET of the memory cell and a capacitor.

6. A semiconductor device according to claim 5, wherein said capacitor includes a conductive layer extending above the gate electrode of the MISFET of the memory cell.

7. A semiconductor device according to claim 1, wherein said second region is in self-alignment with the gate electrode of the p-channel MISFET and said first region is in self-alignment with the side wall insulating films of the p-channel MISFET; and wherein said fourth region is in self-alignment with the gate electrode of the n-channel MISFET and the third region is in self-alignment with the side wall insulating films of the n-channel MISFET, whereby the second region is provided to be smaller in the direction of channel length, than the fourth region.

8. A semiconductor device according to claim 1, wherein said second portion is a well region formed in the semiconductor substrate extending to said surface, and said MISFETs of the second group are formed in said well region formed in said semiconductor substrate.

9. A semiconductor device according to claim 1, wherein the second region, of said p-type MISFET, has a depth from a substrate surface that is smaller than the depth of said first region.

10. A semiconductor device according to claim 1, wherein the fourth region, of said n-channel MISFET, has a depth from a substrate surface that is smaller than the depth of said third region.

11. A semiconductor device according to claim 1, wherein the length of the side wall insulating films of said n-channel MISFET, along the direction of channel length, is at least about 0.3 $\mu$m.

12. A semiconductor device according to claim 11, wherein the length of the side wall insulating films of said p-channel MISFET, along the direction of channel length, is at most about 0.3 $\mu$m.

13. A semiconductor device according to claim 1, wherein the length of the side wall insulating films of said p-channel MISFET, along the direction of channel length, is at most about 0.3 $\mu$m.

14. A semiconductor device according to claim 1, wherein the second portion is a well region provided in the semiconductor substrate, said well region being of n-conductivity type, the p-channel MISFET being formed in said well region.

15. A semiconductor device according to claim 14, wherein the first portion is another well region provided in the semiconductor substrate, said another well region being of a p-conductivity type, the n-channel MISFET being formed in said another well region.

16. A semiconductor device according to claim 11, wherein the length of the side wall insulating films of said p-channel MISFET, along the direction of channel length, is 0.1 $\mu$m to 0.25 $\mu$m.

* * * * *